United States Patent [19]

Meiri et al.

[11] Patent Number: 5,241,185
[45] Date of Patent: Aug. 31, 1993

[54] PROXIMITY CORRECTION METHOD FOR E-BEAM LITHOGRAPHY

[75] Inventors: Abraham Z. Meiri, Haifa; Dov Ramm, Menashe, both of Israel

[73] Assignee: International Business Machines Corporation, Armonk, N.Y.

[21] Appl. No.: 818,183

[22] Filed: Jan. 8, 1992

[30] Foreign Application Priority Data

Jan. 24, 1991 [IL] Israel .................................... 097022

[51] Int. Cl.$^5$ .......................................... H01J 37/304
[52] U.S. Cl. .................................................. 250/492.2
[58] Field of Search ................. 250/398, 492.2, 492.22

[56] References Cited

U.S. PATENT DOCUMENTS

| | | | |
|---|---|---|---|
| 4,463,265 | 7/1984 | Owen et al. | 250/398 |
| 4,500,790 | 2/1985 | Bretscher et al. | 250/397 |
| 4,520,269 | 5/1985 | Jones | 250/492.22 |
| 4,943,729 | 7/1990 | Ando et al. | 250/398 |
| 5,051,598 | 9/1991 | Ashton et al. | 250/492.3 |

FOREIGN PATENT DOCUMENTS 0110042  9/1983  European Pat. Off. .

OTHER PUBLICATIONS

J. M. Pavkovich, "Proximity Effect Correction Calculations by the Integral Equation Approximate Solution Method", J. Vac. Sci. Technol. B 4 (1) Jan./Feb. 1986 pp. 159–163.
P. Dean Gerber, "Exact Solution of the Proximity Effect Equation by a Splitting Method", J. Vac. Sci. Technol. B vol. 6, No. 1, Jan./Feb. 1988, pp. 432–435.
O. W. Otto et al. "Proximity Correction of the AEBLE-150", J. Vac. Sci. Technol. B 6 (1) Jan./Feb. 1988, pp. 443–447.
Y. Machida et al. "Proximity-Effect Correction for VLSI Patterns in Electron-Beam Lithography", Microelectronic Engineering 2 (1984), pp. 245–257.

Primary Examiner—Bruce C. Anderson
Attorney, Agent, or Firm—John J. Goodwin; Blaney Harper

[57] ABSTRACT

A method of proximity correction in an E-beam lithography system wherein each design shape is contracted by a predetermined bias and the E-beam dose required at any given point of the design is determined such that each of the design shapes is enlarged, on development, by the value of the predetermined bias, the determination of the E-beam dose being made in accordance with a predetermined relationship between an indicator, such as the electron backscatter, and the required E-beam dose, the indicator being defined for a plurality of points arranged on a coarse grid on the design and being indicative of the degree of the proximity effect at the respective point, the determination of the required dose being made by solving, at each of the plurality of points on the design, an integral equation relating the indicator to the E-beam dose distribution.

13 Claims, 4 Drawing Sheets

PROXIMITY CORRECTION METHOD FOR E-BEAM LITHOGRAPHY

BACKGROUND OF THE INVENTION

Field of the Invention

The invention relates to a method of proximity correction for E-beam lithography.

In the technique of electron beam lithography an electron beam is used to delineate the features of a semiconductor device by selectively irradiating a substrate coated with an electron-beam sensitive resist. The electron beam is deflected and shaped in a precise manner to define the required shape in the resist. The pattern is then developed in the resist. The substrate can be either a semiconductor wafer, as in the case of direct-write lithography, or glass, metal or other material as in the case of a high resolution mask for subsequent use in fabricating the semiconductor device.

When an electron beam penetrates a material, such as the electron-beam sensitive resist or the substrate, the electrons in the beam collide with molecules in the material and are scattered in all directions from the resist and the substrate. The electrons are scattered both in the forward direction, mainly from the resist, and laterally and in the backward direction, mainly from the substrate. The scattering causes regions of the resist nearby to directly exposed regions to be additionally exposed to scattered electrons. This has the effect of reducing the resolution of the technique. The electrons which are back-scattered from the substrate affect a larger area of the resist than the electrons which are forward scattered from the resist. The spreading of the electron beam due to the backscattered electrons is usually characterized by a parameter $\beta$, the backscatter range, which is of the order of 2 $\mu$m to 10 $\mu$m. The spreading of the electron beam due to the combined effect of the forward scattering, beam defocussing and aberrations is usually characterized by a parameter $\alpha$ which is of the order of 0.1 $\mu$m.

When two regions to be directly exposed are positioned close together, each receives not only the direct electron beam exposure during irradiation of that region, which will hereinafter be referred to as "the incident dose", but also an extra exposure due to the lateral scattering of electrons while directly exposing the adjacent regions. Consequently, closely spaced regions become more heavily exposed from the same incident dose than isolated regions. The resist in the gap between the two closely spaced shapes will receive exposure from the scattered electrons of both shapes. The effect of this is to narrow the gap between the shapes.

This phenomenon is referred to as the "proximity effect". In the manufacturing of VLSI masks and/or chips by E-Beam lithography it causes deformations of the developed shapes and is a major problem, particularly when the smallest gap or shape size is less than 1 $\mu$m.

Many techniques have been used which try to eliminate or reduce the proximity effect including varying the energy of the electron beam, the region of the E-Beam application, the materials of the substrate and the resist and using multi-layer resists.

A first main way of correcting for the proximity effect is to modify the E-Beam incident "dose" applied at each point of the resist, without modifying the design shapes, in a way which takes into account the layout of the chip/mask image that is required. The calculation of the modification to the E-beam dose required at each point is non-trivial and cannot be performed exactly without compromising some additional technical requirements, such as nonnegativity of the off-shape dose and stability of the solution for the incident dose.

One scheme for eliminating the proximity effect in this way is called GHOST and is described in J. Appl. Phys. 54(6), pp. 3673–3681, (1983) and EP-A-97 417 of Owen and Rissman. This scheme uses an approach of "equalizing the off-shape exposure". In this scheme, in addition to an on-shape dose, off-shape points are also directly exposed with a dose to compensate for the uneven exposure by the back-scattered electrons. The resist therefore receives a constant offset background exposure at all off-shape points over its entire surface and the resulting pattern is undistorted. This, however, has the disadvantages of lower contrast and lower throughput because of the off-shape exposure.

Another approach to proximity correction are what could be termed exposure equalization" methods. In "exposure equalization" methods the values of the incident dose over the surface of the resist are modified so as to achieve equal exposure values at all on-shape points.

A particular method of "exposure equalization" type, the so-called self-consistent technique, is described in J. Vac. Sci. Tech. 15, p. 931, (1978) and in IBM J. Res. Develop. 24 pp. 438–451, (1980). The designed set of shapes is first divided into a set of subshapes, which are sufficiently small that it can be assumed that the correction factor is constant across each subshape. The requirement of the self-consistent technique is that the average exposure be equal for all subshapes. This leads to a fully determined system of linear equations for the correction factors. This method is capable of producing excellent results. However, it has the problem that the linear system of equations is usually ill-conditioned, especially for large numbers of subshapes. This results in highly unstable solutions, which are very dependent on the precision of the input parameters and prone to large errors. Another disadvantage of this technique is its prohibitively high computational load, especially for submicron technologies and/or for high accelerating voltages.

A further method of the "exposure equalization" type has been described in EP-A-166 549 of Pavkovich and in J. Vac. Sci. Tech. B 4(1), pp. 159–163, (1986) by Pavkovich. The method uses an approximate solution of the basic integral equation, which describes the requirement of equal on-shape exposure. This method overcomes a problem of the high computational load of the self-consistent technique by using a coarse grid for a solution.

However, the exposure equalization methods, in general, are sensitive to process tolerances, and require a lot of trial and error to arrive at starting parameters that give acceptable results. Basic parameters, such as the development time, generally depend on the chip/mask image density, so that each design usually requires individual processing and development adjustments.

Another problem associated with methods of the exposure equalization type is that attempts to account for a finite value of the spreading of the electron beam due to the forward scattering, characterized by the parameter $\alpha$, lead to ill-posed problems. This results in highly oscillatory incident doses, which could even have unrealizable negative solutions for the incident dose.

In another group of methods of this type, for example those published in J. Vac. Sci. Technol. B 4(1), pp. 168-175, (1986) by Haslam and McDonald and in J. Vac. Sci. Technol, B 6(1), pp. 432-435 by Gerber, attempts were made to choose the incident dose so that the exposure be constant on-shape and zero off-shape. Since the exposure cannot be zero off-shape, due to the backscatter, these techniques obtain unphysical negative incident off-shape doses by solving the corresponding integral equations. The truncation of the dose value at zero leads to further uncontrollable image distortions.

An important improvement to the self-consistent technique was first described in a paper by Berkowitz, Cook, Kwiatkowski and Goodreau, "Edge-Controlled, Self-Consistent Proximity Effect Corrections," pp. 125-142 in Semiconductor Processing ASTM STP 850, edited by D. C. Gupta, American Society for Testing and Materials (publisher), 1984. In this method the self-consistent technique is extended so that the average exposure over each exterior edge of a subshape is equal to the critical exposure value, hereinafter referred to as the "threshold value", such that edges are developed just to the desired location.

A further development of this method has been published in J. Vac. Sci. Technol. B 6(1), pp. 443-447, (1988) by Otto and Griffith. In this paper the test points are defined for each subshape. For edge subshapes the test points are chosen on their edges and the exposure at these test points is constrained to be threshold value. For interior subshapes the test points are chosen in their centres and the exposure there is specified at some value above the threshold. The system of linear equations which has to be solved is analogous to that of the self-consistent method. Although providing better pattern accuracy, this method suffers from all the other disadvantages of the self-consistent technique, in particular it requires unacceptably long CPU times.

The second main way of correcting for the proximity effect modifies the zone of application of the incident dose so as to provide a correct size of the final developed pattern.

One example of this is the scheme disclosed in EP-A-110 042 of F. Jones. In this scheme the constant dose is applied within contracted areas of each subshape, including edge and interior subshapes. The contraction is performed by decreasing all sides of a subshape by a constant distance, hereinafter referred to as the "bias". The method lacks the flexibility of a correction by a dose value modification, hence it is generally impossible to obtain high quality lithographic patterns with this method.

It is clear that the combination of the two aforementioned main ways of proximity correction could provide further improvement of pattern fidelity and/or further reduction in lithography sizes in the submicron range. It is common practice to apply a "bias" to the desired shapes, that is to expose smaller shapes than in the original design in order to account for various factors in the VLSI fabrication process that lead to the shape enlargement. For example, due to certain optical phenomena in the lithography process, the final VLSI pattern could enlarge, compared with its mask. Therefore the mask, which is fabricated by the E-beam lithography, has to be slightly contracted. On top of all biases dictated by the fab process in the art of E-beam lithography it is customary to apply an extra "bias" to the desired shapes, in order to account for shape enlargement due to the proximity effect and the resist dissolution in the lateral direction during the development process.

In the paper in J. Vac. Sci. Technol. B 3(1), pp. 148-152, (1985) by Chen, Neureuther and Pavkovich an attempt was described of equalizing the development bias for fabrication of long isolated lines of different widths. However, the scheme is only a rough approximation for a particular case and has not evolved into a generic approach, since the bias was not expressed in terms of the correct parameters.

Prior art proximity correction methods have all proved insufficient for E-beam lithography in manufacturing VLSI patterns with design rules in the submicron range.

It is, therefore, the object of this invention to provide a systematic method for correcting the proximity effect, which method is suitable for use in a manufacturing environment.

Therefore, in accordance with the present invention there is provided a method of proximity correction in an E-beam lithography system for exposing, on a E-beam sensitive resist, a design comprising at least one design shape, the method comprising determining the E-beam dose required at any given point of the design such that, on development, a shape control requirement is satisfied, wherein the determination of the E-beam dose is made in accordance with a predetermined relationship between an indicator and the required E-beam dose, the indicator being indicative of the degree of the proximity effect any point on the design, is such that at points not on a design shape the dose is constrained to be zero, and comprises the step of calculating the solution, at least at a plurality of points on the design, of an integral equation relating the indicator to the E-beam dose distribution.

Generally the amount of shape widening at a straight edge depends on the incident dose and the backscatter just around the edges of the shape, but not on the size of the shape. This is true as long as the shape is not too small so that the effect of the forward scattering is significant and has to be taken into account.

If dose values can be determined that give equal shape widening for all the design shapes, then using that shape-widening as the bias or etch parameter for contraction of design shapes prior to their exposure would assure that the final edge locations are correct. This requirement will be henceforth referred to as "the etch equalization" principle.

Therefore in a preferred form of the invention the method comprises the prior step of contracting each design shape by a predetermined bias to form a contracted design shape and the shape control requirement is that each contracted design shape be enlarged, on development, by the value of the predetermined bias.

The shape contraction or "pre-etching" is done as part of postprocessing. Usually post-processors use one single etch value that is applied to all shapes.

The method of the invention enables proximity correction to be performed which results in an accurate chip/mask image and at the same time allows relatively "loose" tolerances in the parameters for the lithography process and a gain in the E-beam tool throughput. These loose tolerances for the operating parameters and the increase in computational efficiency make the method particularly suitable for use in a manufacturing environment.

Preferably the determination of the E-beam dose comprises combining the values of the indicator at ones of the plurality of points. This allows values of the required dose to be found by interpolation of the indicator for locations on the design intermediate those at which the integral equation is solved.

The indicator can be any function that is indicative of the degree or magnitude of the proximity effect. Preferably the indicator is the electron backscatter, however the indicator can also be any other function of the backscatter such as a dose boost function which, at any given point of the design gives the value of the dose such that a shape edge at that point would, on development, have the correct locations. In this case the predetermined relationship between the indicator and the required dose is that the required E-beam dose is equal to the indicator for points which lie on a contracted design shape.

In the case where the indicator is the electron backscatter the predetermined relationship can be predetermined by determining, for the E-beam lithography system and a predetermined value of the bias, a relationship between the backscatter at a point on the edge of a design shape and the E-beam dose required at that point such that the edge of the design shape be moved, on development, by the value of the bias.

The dependence of the shape widening on the incident dose and the background backscatter can be determined either by an experimental calibration of a particular lithography system or by computer modelling of the development process.

The incident dose D required to obtain equal shape widening at all the shape edges depends on the background backscatter S. Hence an operational curve, $D=f(S)$, can be deduced from the dependence of the shape widening on the incident dose for a given ETCH value of the shape widening. This operational curve $D=f(S)$ will henceforth be referred to as a D-S diagram.

The D-S diagram can be applied as an operational curve for all on-shape points. Since the background scatter S is in turn defined by the incident dose distribution, namely it equals the convolution of the backscatter kernel $B(x,y)$ with the dose distribution $D(x,y)$, the final dose distribution satisfies the integral equation, which has to be solved prior to the final dose assignment.

Certain thin and/or high contrast resists, such as the imaging layer in a multi-layer resist, are well described by a "threshold model", at least for technology groundrules that are wider than $3\alpha$. According to the threshold model all resist points where the exposure is above the threshold value are fully dissolved by a developer, and at all other points of the resist some residual thickness remains after development. In this case the incident dose values can be assigned so as to provide equal exposure values at all the shape edges. That single edge exposure value is equal to the threshold value. With that requirement satisfied, the exposure has a sharp front across any shape edge, the edge point being the point of the maximal slope. Since normally the forward scatter is characterized by a narrow symmetric kernel the exposure front is also symmetric with respect to the threshold level. This requirement will be henceforth referred to as "the exposure symmetrization" principle. In this form of the invention the predetermined relationship, between the backscatter and the required dose, is represented by the equation $D=2t-2S$, where D is the required dose, S is the backscatter and t is a threshold dose wherein if the dose applied to a point on the resist is greater than the threshold dose the resist is completely dissolved, on development, at that point.

For inner points of each shape, whose distance from the shape edge is greater than a couple of $\alpha$, the required incident dose can be smaller than the dose that is given by the D-S diagram, without significantly affecting the final edge location. In order to decrease the background backscatter it is advantageous to use incident dose values at these points which are as small as possible.

In accordance with this, the invention provides an option, that the requirement of equal widening be applied only to the external sleeves while for inner points an additional requirement holds. This is that the dose at inner points has to be chosen so as to assure that all the thickness of the resist will be dissolved, with some safety factor of overdosing. Therefore, two different D-S diagrams can be used for the external sleeves and for inner points.

Therefore in a preferred form of the invention the method further comprises the step of partitioning, prior to determination of the required dose, the shapes of the design into edge regions and internal regions each internal region being completely surrounded by an edge region, and wherein the E-beam dose for points in the internal regions is determined with the additional constraint that on development all the resist at that point be dissolved.

The incident dose for small shapes, i.e. whose dimension is $5\alpha$ or less, can be additionally boosted in order to correct for the combined effect of forward scattering and beam divergence. The correction factor or $\alpha$-boost factor, depends mainly on a shape size and also slightly on the backscatter S. The dependence of $\alpha$-boost is registered either in a calibration experiment or by computer modelling of the lithography process. In a further preferred form of the invention the step of determining the required dose comprises multiplying the dose by a correction factor, the correction factor substantially correcting for the shape distortion due to the forward scattering of the electrons from the resist.

Since the invention involves solving an integral equation for an indicator function, such as the backscatter, which only varies slowly across the design, the solution of the integral equation can be performed on a very coarse grid, coarser than the design shapes themselves i.e. typically about 1 $\mu$m for a 25 KeV machine.

Therefore in a preferred form of the invention the plurality of points, at which the integral equation is solved, are arranged on a cartesian grid, the spacing of the grid points being greater than the smallest linear dimension of the smallest design shape. The use of a relatively coarse grid greatly increases the speed and the computational efficiency of the method.

The invention further provides a process for E-beam lithography comprising the above proximity correction method and a method for manufacturing an integrated circuit comprising the E-beam lithography process.

In accordance with another aspect of the invention there is provided a proximity correction system for an E-beam lithography system wherein a design comprising at least one design shape is exposed on an E-beam sensitive resist, the system comprising means for contracting each design shape by a predetermined bias to form a contracted design shape and logic for determining the E-beam dose required at any given point of the design such that each contracted design shapes is enlarged, on development, by the value of the predetermined bias, and wherein the determination of the required E-beam dose is made in accordance with a predetermined relationship between an indicator and the required E-beam dose, the indicator being indicative of the degree of the proximity effect at any point on the design, the required E-beam dose is constrained to be zero at points not on a design shape and the determining logic comprises logic for calculating the solution, at the plurality of points on the design, of an integral equation relating the indicator to the E-beam dose distribution.

BRIEF DESCRIPTION OF THE DRAWINGS

Embodiments of the invention will now be described by way of example with reference to the accompanying drawings wherein.

The embodiments of the invention are methods which consist of two parts, the calculation of the dose and a prior calibration stage.

Figure 1:
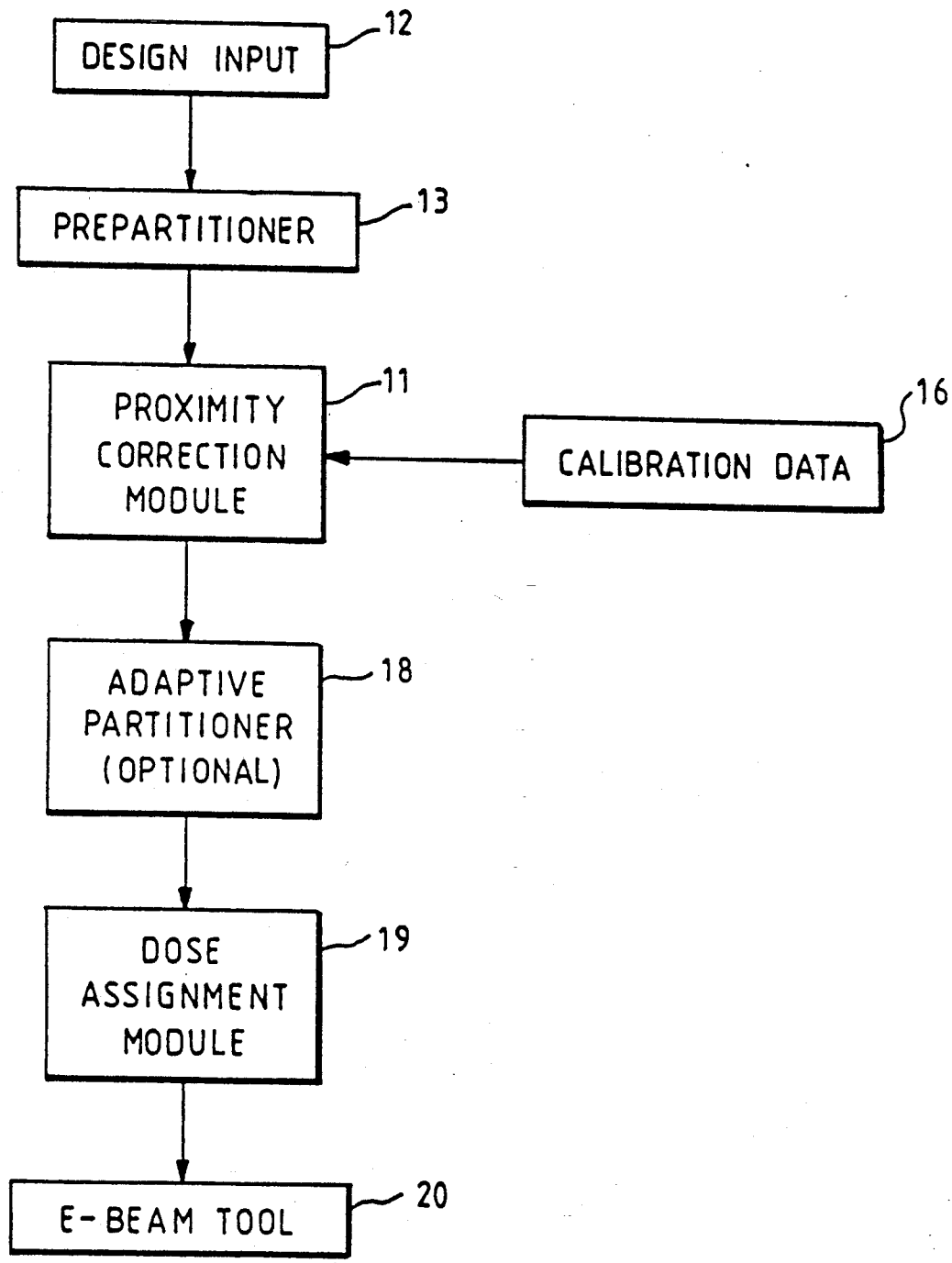
FIG. 1 is a schematic diagram of a Post-processor.

The calculation of the dose is performed by a Post-Processor, which could be implemented in software or hardware or as a combination of software and hardware. The post-processor translates the design specifications into numerical control (NC) data for an E-beam writing tool. FIG. 1 is a schematic diagram of such a Post-processor. The proximity correction module 11 performs the proximity correction computations, i.e., it solves, for the electron backscatter, the integral equation relating the electron backscatter to the applied dose distribution at points on a coarse grid. The module 11 takes the input design data at input 12 which is pre-partitioned in a prepartitioner 13. The proximity correction module 11 also uses the calibration data 16 that characterise the particular E-beam lithography system. The term "E-beam lithography system" will be used to refer to the particular combination of E-beam resist, developer, development process and E-beam tool.

The data produced by the proximity correction module are then optionally further processed in the adaptive partitioner 18 in order to partition the shapes of the design into primitive subshapes over which a constant dose is applied to the resist. The dose assignment module 19 uses the data from the proximity correction module 11 together with the adaptively partitioned design data and performs the final computation of the incident dose required to expose each primitive subshape. The partitioned data together with the assigned dose are then used to control the E-beam tool 20.

The calibration process determines the data 16 describing the relevant properties of a particular E-beam lithography system. It includes a set of specific patterns being written onto the resist by the E-beam tool and then developed, a measurement procedure for analyzing the developed patterns and processing of the measured data and/or simulation of the resist behavior to obtain the necessary parameters of the system. The calibration process provides the data needed by the Proximity Correction Module of the Post-Processor.

The dose required to give a particular amount of shape widening at each point of the design near the shape edge is a function of the electron backscatter at that point. This is because the magnitude of the proximity effect depends on the amount of the backscatter. The dose at points within the shapes but not near the edges does not significantly affect the widening of the shapes and therefore should have the minimum possible value, which is just enough for the resist to be completely removed on development. Also a given amount of overdose may be used in internal regions in order to increase the reliability of resist removal.

Figure 2:
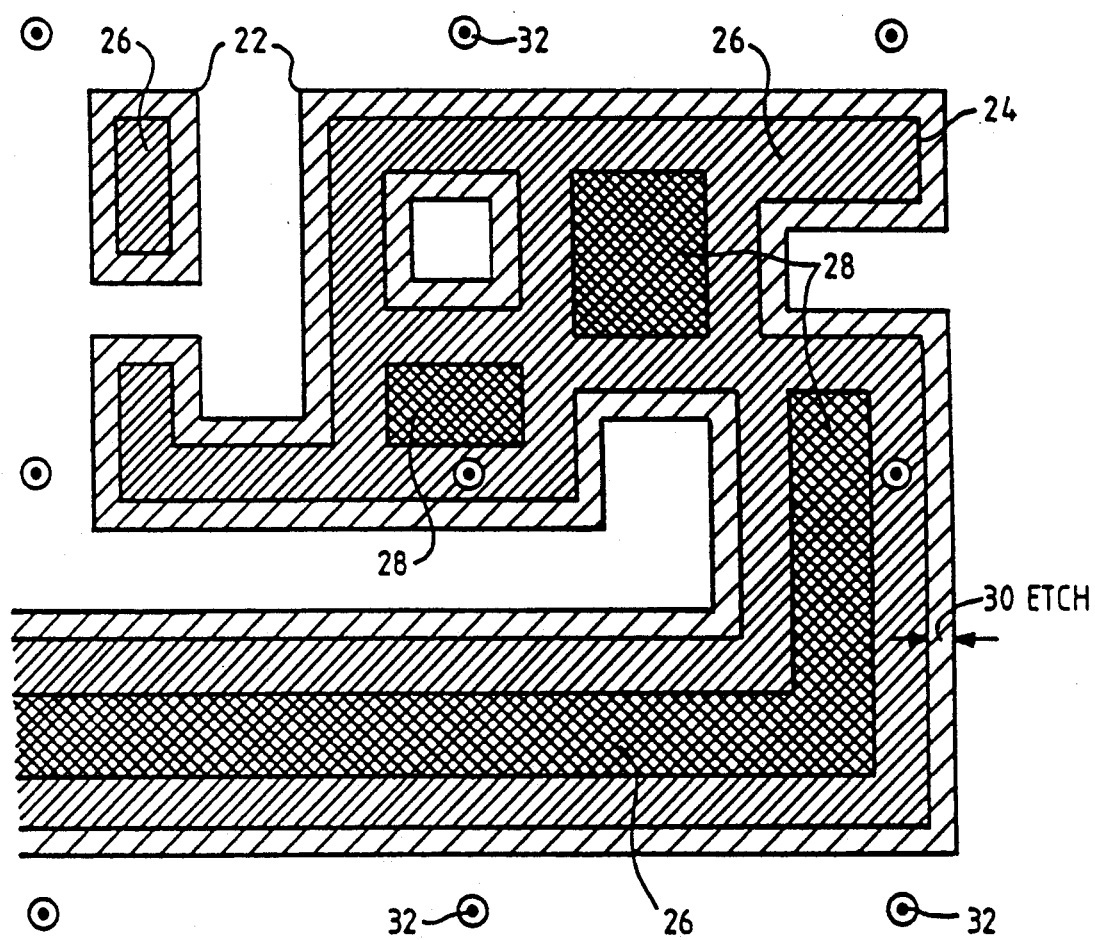
FIG. 2 shows an illustrative design to be impressed on a substrate.

FIG. 2 shows a shape for an electronic circuit which is to be impressed upon a substrate. The desired shape 22 is described by its characteristic function $M(x,y)$ such that $M(x,y)=1$ on the shape and $M(x,y)=0$ off the shape. The shrunken or contracted shape 24 which is to be exposed by the E-beam is described by its characteristic function $M'(x,y)$ such that $M'(x,y)=1$ within the outline of the shape 24 and $M'(x,y)=0$ otherwise.

The contraction is performed by the Post-Processor in some stage prior to prepartitioning 13 on FIG. 1. This stage is not shown on FIG. 1, since it is a part of common practice.

The contracted design shapes are divided into regions near the edges 26 and internal regions 28, henceforth "edge regions" and "internal regions". This preliminary partitioning is performed by the prepartitioner 13 of FIG. 1. The doses for these internal and edge regions are determined differently. The etch parameter is represented by the distance 30. Grid points 32 are arranged in a square cartesian grid. The relative position of the grid and the design shapes is irrelevant.

In a first embodiment of the invention the value of the dose that is needed to give a particular degree of widening of the shapes for a given amount of backscatter at a particular point is looked up in what is termed D-S function tables or D-S diagrams. These tables relate the value of the dose D that is needed at each point as a function of the backscatter S at that point so as to assure the correct edge widening, in the case of points in the edge regions or the correct overdosing in the case of points in the internal regions.

The functions relating D and S are determined during a calibration procedure and will be denoted $D=f_e(S)$, for edge regions, and $D=f_i(S)$, for internal regions. They depend on the chosen development time and there is a different function for each value of the ETCH parameter. The functions also depend on whether the costant ETCH is required at either the resist bottom or at the resist top. $f_e(S)$ may usually be very well approximated by a parabola and therefore three parameters need to be determined in the calibration process. $f_i(S)$ may usually be very well approximated by a straight line and therefore only two parameters need to be determined in the calibration process. The requirement of equal shape widening is restated in terms of these D-S functions. It should be noted that the D-S diagrams can either be precalculated and stored in a look-up table and the value of D looked up therein or, alternatively, the value of D can be calculated from the approximate functional form.

Figure 3:
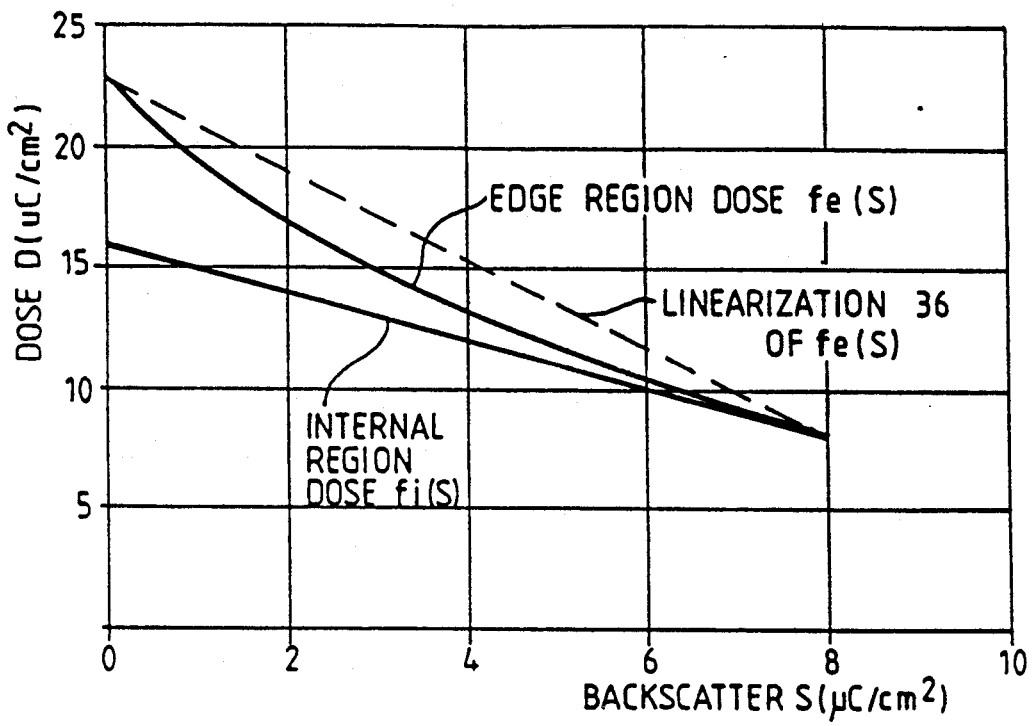
FIG. 3 shows an example of D-S diagrams both for points in the edge regions and for points in the internal regions.

FIG. 3 illustrates an example of the D-S functions, computed for $\alpha=0.1$ $\mu$-m and the bias=ETCH=0.075 $\mu$m. The broken line 36 corresponds to a linearized dose curve for the edge regions.

The D-S functions for internal and edge regions are unified into a single function using a crossover function to switch between $f_e$ and $f_i$, writing $D = f_{e/i}(S)$ where the function $f_{e/i}$ is switched from $f_e$ to $f_i$. For example:

$$f_{e/i}(S) = f_e(S)(1 - g(x,y)) + f_i(S)g(x,y), \quad (1)$$

where the crossover function, $g(x,y)$ switches abruptly from value 0 at the shape edge to value 1 for points in internal regions. It should be noted that $g(x,y)$ could, alternatively, switch smoothly between 1 and 0, for example it could be defined as a ratio of the distance, $d(x,y)$, from a point $(x,y)$ to the shape edge and, say, $5\alpha$, the maximum value of the function g being limited by 1: $g(d) = \min:\{1, 5\alpha/d\}$.

The dose for small shapes has to be additionally boosted in order to correct for forward scattering of the electrons. This is referred to as the intra-shape proximity effect and needs to be corrected for shapes whose design size is less than $5\alpha$, where $\alpha$ is the size parameter characterizing the spreading of the electron beam due, principally, to the forward scattering of the electrons.

$\alpha$ is typically of the order of 0.1 μm. For tiny rectangular shapes with size smaller than $5\alpha$, the dose is assigned an additional $\alpha$-boost coefficient, which depends on the backscatter $S(x,y)$ and on the shape size. For long lines with width w the $\alpha$-boost depends on the width. For a rectangular primitive shape of size $w_x$ by $w_y$ the $\alpha$-boost equals the product of the $\alpha$-boosts in the x and y directions.

Figure 4:
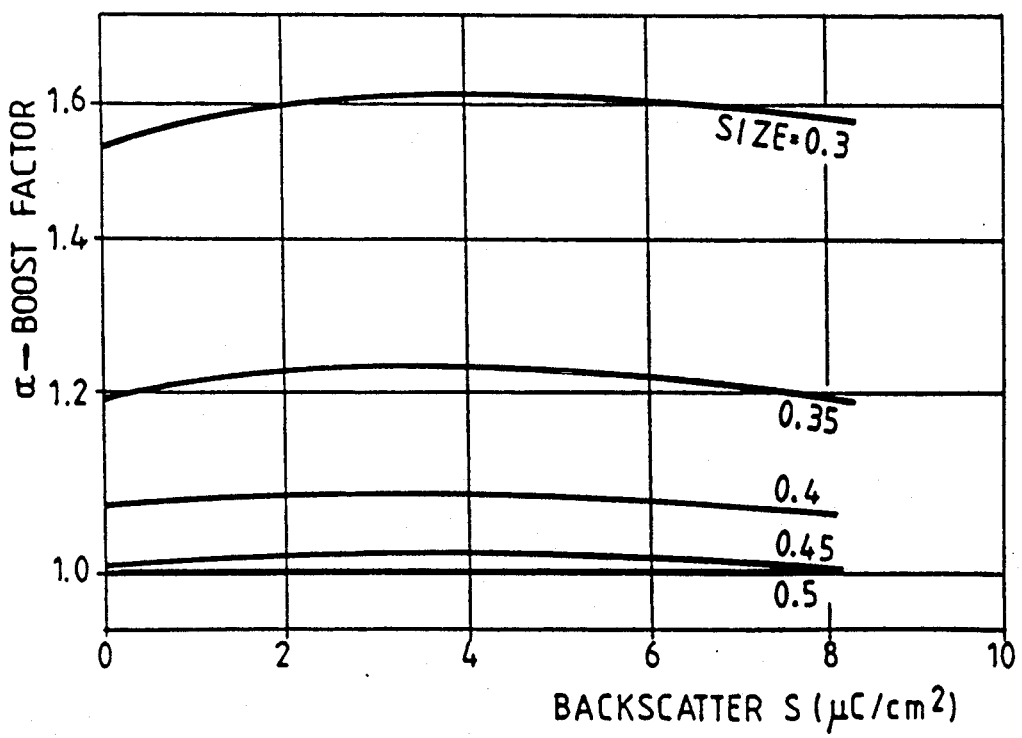
FIG. 4 shows an example of the $\alpha$-boost diagram.

FIG. 4 shows an example of $\alpha$-boost diagram for $\alpha = 0.1$ μm and the bias = ETCH = 0.075 μm. It shows several curves for different line sizes. For sizes greater or equal 0.5 μm ($= 5\alpha$) the $\alpha$-boost factor equals 1.

Tables describing the dependence of the $\alpha$-boost on the shape size and the backscatter are determined in the calibration procedure. The $\alpha$-boost curve may usually be very well approximated by a parabola and therefore only three parameters need to be determined in the calibration process. The dependence of the $\alpha$-boost on $S(x,y)$ is not very strong and may be neglected in a first approximation. Therefore an approximate $\alpha$-boost coefficient, $\Phi^{\sim}_{\alpha}$, is assigned to each point on the design. This is equal to 1 for shapes whose size is greater than $5\alpha$ and is greater than 1 for shapes whose size is smaller than $5\alpha$. At the end of the proximity correction process the approximate $\alpha$-boost coefficient is replaced by a more precise value depending on the backscatter S at each point. These computations are performed in the dose assignment module 19.

The D-S functions for the dose are incorporated in a nonlinear integral equation for the backscatter field $S(x,y)$ over the design. The incident dose is applied only inside a shrunken design $M'(x,y)$ which represents the design pattern with the shapes uniformly shrunken by the value of the ETCH parameter at each edge. Therefore, the dose at any point $(x,y)$ satisfies the following equation, $$D(x,y) = M'(x,y) \Phi^{\sim}_{\alpha} f_{e/i}(S(x,y)) \quad (2)$$

The backscatter field $S(x,y)$ in turn depends on the incident dose distribution $D(x,y)$ through the operator relation, $$S(x,y) = c\underline{B}[D(x,y)], \quad (3)$$

where the operator $\underline{B}$ is the convolution operator of the normalized kernel $B(x,y)$ of the backscatter and c equals the integral of the kernel over the whole x-y plane. From these two equations it follows, that:

$$S(x,y) = c\underline{B}[M'(x,y) \Phi^{\sim}_{\alpha} f_{e/i}(S(x,y))], \quad (4)$$

where the indices 'e' and 'i' correspond to edge and internal points respectively.

The integral equation (4) is discretized and solved on a coarse rectangular grid. Since the backscatter is slowly varying over the design, the spacing of the grid points may be of the order of a fraction of the long range scattering parameter. This may be in the range 0.2 $\beta$ to $\beta$ depending on interpolation schemes.

Since the function M' describing the design pattern varies on a length scale shorter than the spacing of the grid points, the discretization of the characteristic function $M'(x,y)$ is achieved by replacing $M'(x,y)$ by values $M_{ij}$ of its integral over each grid cell, i.e. $M'(x,y)$ is replaced by the proportion of the area of each cell for which $M'(x,y) = 1$. This process will be referred to as "rasterization".

The $\alpha$-boost factor could be taken into account in a rasterization as an additional weight, which is ascribed to each subshape.

Therefore in the discretized form of the integral equation (4), the backscatter function $S(x,y)$ is represented by its values, $S_{ij}$, at the grid points and the function $\Phi^{\sim}_{\alpha} M'(x,y)$ is represented by its rasterized values $M_{ij}$. The rasterization is calculated separately for internal and edge regions. $M^e_{ij}$ is equal to the integral of $\Phi^{\sim}_{\alpha} M'(x,y)$ over the edge regions of the grid cell i,j and $M^i_{ij}$ is equal to the integral of $\Phi^{\sim}_{\alpha} M'(x,y)$ over the internal regions of the grid cell i,j. For internal regions $\Phi^{\sim}_{\alpha} = 1$. These values $M^{e/i}_{ij}$ are pre-calculated and stored for a given value of the ETCH parameter at the beginning of the proximity correction process.

The discretized integral equation for the backscatter $S_{ij}$ is solved by the Proximity Correction module 11 at all grid points using an iterative method taking into account the preassigned approximate $\alpha$-boost.

For the purposes of solving the integral equation the D-S functions are linearized as follows:

$$f_e(S) = D_e - k_e S + R_e(S) \quad (5)$$

$$f_i(S) = D_i - k_i S + R_i(S)$$

where, typically, the linearization residual $R_i(S)$ is within 10% to 20% of the function values and the residual $R_e(S)$ is less than a couple of percent of the function value.

Two convolutions of the rasterized shrunken design pattern $M'^{e/i}_{ij}$ with the kernel B are pre-calculated and used in the solution of the integral equation. These are denoted $$h_{e/i} = \underline{B}[\Phi^{\sim}_{\alpha} M^{e/i}], \quad (6)$$

for the internal points and the edge points respectively. Indices i and j throughout the grid are omitted here for simplicity. Indices 'e' or 'i' correspond to a contribution of the edge and internal regions respectively.

The basic integral equation for the backscatter is:

$$S + c\underline{B}[k_{e/i} \Phi^{\sim}_{\alpha} M' S] = cB\{\Phi^{\sim}_{\alpha} M'[D_{e/i} + R_{e/i}(S)]\} \quad (7)$$

The first iteration is computed as:

$$S^1(x,y) = c \frac{D_e h_e + D_i h_i}{1 + c[k_e h_e + k_i h_i]} \quad (8)$$

The kth iteration is computed as:

$$S^k(x,y) = S^1 + c \frac{\{S^{k-1}[k_e h_e + k_i h_i] + \underline{B}[M_e(R_e S^{k-1} - k_e S^{k-1}) + M^i(R_i S^{k-1} - k_i S^{k-1})]\}}{1 + c[k_e h_e + k_i h_i]} \quad (9)$$

The integral equation is solved for the backscatter field $S_{ij}$ at all points of the grid. The value of the dose required at any given point on the design to get the desired shape widening may then be found by interpolating the backscatter between the grid points and looking up the required dose in the D-S function table for the calculated backscatter. This dose calculation is performed in the Dose Assignment module 19 of FIG. 1.

As a final step the dose is multiplied by the exact α-boost factor, i.e. using the α-boost function which takes into account both the shape size and the backscatter field.

For resists whose development behavior may be described by a threshold model", i.e. at all points where the exposure was above a certain threshold value the resist is fully dissolved by the developer and at all other points some resist remains after development, a second embodiment of the invention can be used. In this case the requirement that all shapes are, on development, at design locations can be satisfied if dose values are assigned so as to ensure an equal exposure at all the shape edges. This requirement of equal exposure at all the shape edges can be achieved if, for the edge regions, the exposure, E, is adjusted to be:

$$E + 2t = S. \quad (10)$$

where t is the value of the threshold, given by $$t = 0.5 + c. \quad (11)$$

This implies that the relationship between D and S for the edge regions is, $$D = 2t - 2S = 1 + 2c - 2S. \quad (12)$$

For internal regions it could be assumed that $$D = 1 + c - S \quad (13)$$

The advantage of using this approach is that t is a global constant, i.e. it does not depend on the particular set of shapes being exposed and does not change across the wafer or from wafer to wafer. There is no need to fine tune the threshold value for a particular design.

The integral equation linking the backscatter to the dose applied over the design is solved iteratively using the rasterized functions $M^{e/i}$ and $h_{e/i}$ as before.

The first iteration is given by:

$$S^1 = c \frac{(1 + 2c)h_e + (1 + c)h_i}{1 + c(2h_e + h_i)} \quad (14)$$

and subsequent iterations are given by, $$S^k = S^1 + c \frac{S^{k-1}[2h_e + h_i] - \underline{B}[2M^e + M^i S^{k-1}]}{1 + c[2h_e + h_i]} \quad (15)$$

In practice it has been found that only two iterations are necessary to obtain sufficient precision.

Once the solution has been found for the backscatter S the method proceeds as in the first embodiment i.e. the shapes are partitioned into rectangles of constant dose and the dose calculated from the average value of the backscatter over each rectangles using the relation (12).

The particular embodiments of the invention described here are for variable shape E-beam tools, in which a constant dose is applied to rectangles. In order to provide control data for such an E-beam tool the design must be divided into a number of rectangles to which a constant dose is applied. This can be achieved in several ways.

For example the design shape can be first subdivided, by the prepartitioner 13 into a number of primitive subshapes, e.g. rectangles. The dose is assumed to be constant inside each of these primitive subshapes. The backscatter representative value (e.g. backscatter average) at each primitive subshape is computed by interpolation of the grid values $S_{ij}$, which have been obtained as a solution of the basic integral equation. The dose value is then looked up in the D-S diagram for that representative backscatter value. The dose is then multiplied by the exact α-boost factor, which is looked up in the α-boost table, using the size of a primitive subshape and the representative backscatter value. That final value of the incident dose is used for actual exposing the primitive subshape under consideration.

Alternatively an adaptive partitioner 19 can partition the design shapes into rectangles after the proximity effect correction. The prepartitioner 13 only subdivides the shapes into edge regions and internal regions. The adaptive partitioner 19 further analyses the backscatter field to define a further partitioning of that subarea into primitive subshapes. Once such adaptive partitioning is accomplished the constant dose required within each primitive subshape is calculated exactly by looking up the value of the backscatter in the D-S look-up table using the exact α-boost as above.

The calibration required to carry out the above proximity correction will now be described.

The full set of parameters needed for implementation of the invention is as follows:

1. The kernel of the backscatter operator B(x,y) or, alternatively, if it is to be approximated by a Gaussian, the value of β, and the magnitude coefficient c;
2. The D-S function for points on the edges of the shapes, i.e. $D = f_e(S)$ for a given value of the etch parameter and development-time.
3. The D-S function for the internal points, i.e. $D = f_i(S)$ for the same value of the etch parameter and development-time;
4. The α-boost function, i.e. a series of curves for α-boost vs backscatter S with the shape size as a parameter: $\Phi_\alpha = \phi(w, S)$.

A calibration by experiment method is used to provide these input parameters. In the experimental calibration special calibration patterns are exposed, developed and measured. For submicron technologies they are measured by E-beam microscopy. A special calibration program module uses the results of the measurements plus additional engineering data, such as nominal current-density/development-time, desired overdosing at internal points, development time tolerances etc, and calculates the E-beam lithography component of the ETCH value, the development-time and/or base-dose (if not specified at the input), and a set of tables that are to be fed into the Proximity Correction module. Processing the measured data produces the required parameters and functions.

The special calibration patterns have to contain a dense enough sample of all relevant combinations for the dose, size and backscatter, so that from measuring line widths after development it is possible to derive the D-S and the $\alpha$-boost diagrams. The line width could be measured either on the top or on the bottom of the resist depending on whether the line width control is required on the top or the bottom. We sketch here the main stages of the calibration process and describe an example of a calibration shape pattern.

The value of $\alpha$ is not used explicity. However, to initiate the calibration some initial rough estimates of $\alpha$, $\beta$ and c are needed. We assume that the ETCH parameter is given. Alternatively, the overdosing for large shapes could be given. Development time is fixed.

For most applications the D-S function for internal points is well approximated by a straight line and the D-S function for the edge points is well approximated by a parabola. The $\alpha$-boost as a function of S is also well approximated, for each value of the shape size, by a parabola. Therefore, for the calibration of the D-S diagram for the edge points and $\alpha$-boost diagram, only three points per curve are sufficient.

Figure 5:
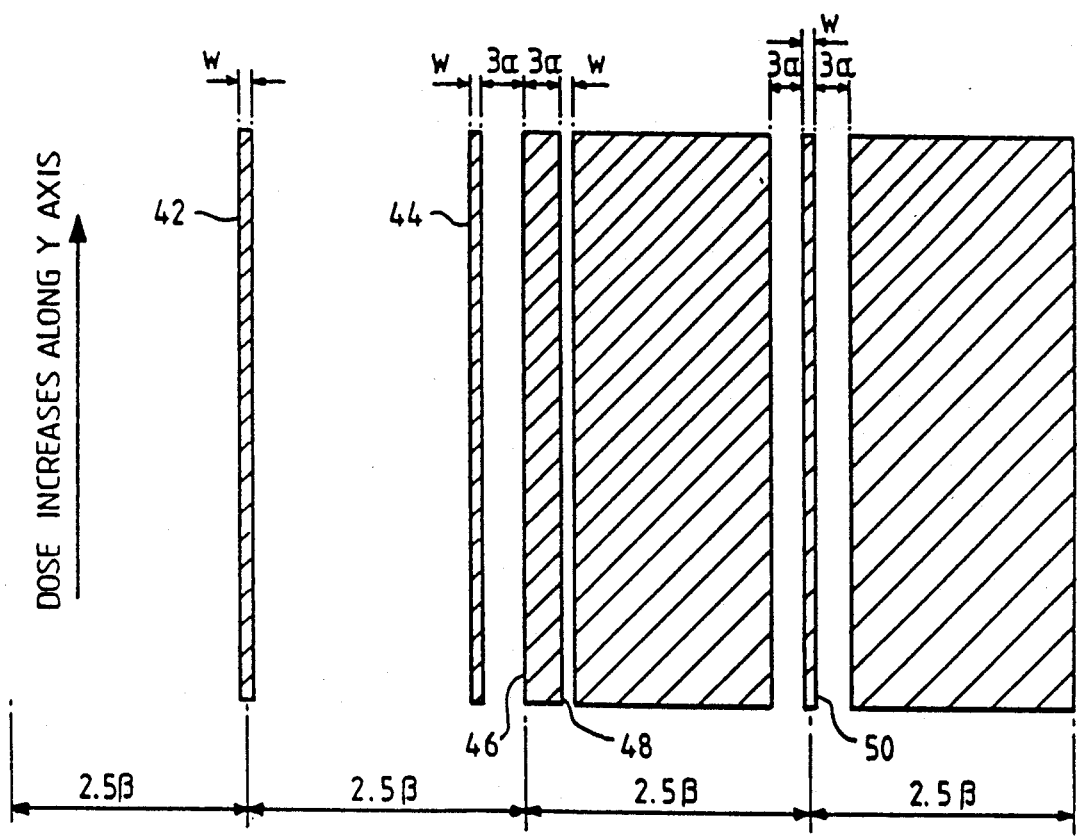
FIG. 5 shows a test pattern for use in a calibration of the proximity correction system.

The calibration process comprises exposing, developing and measuring the width of a special pattern, which is a repetition of the basic pattern shown in FIG. 5, the dose is applied across the dark areas. The amount of dose slowly increases along the y axis. The basic pattern, shown on FIG. 5, is repeated with different line widths w beginning from about $5\alpha$ and lower. The dose D(y) for the narrow lines 42, 44 and 50 and for the remaining area, shown on FIG. 5 in a dark color, slowly increases along the y-axis, so that $(\beta/D(y)) \times (dD(y)/dy) << 1$. The narrow lines, designated 42 and 44 on FIG. 5, are exposed with additional boost coefficients $\Phi_1$ and $\Phi_2$ respectively.

The basic pattern with a line width w of about $5\alpha$ serves for a determination of D-S diagram. For this purpose the line widths of the narrow lines 42 and 50 of FIG. 5 are measured, and the heights $h_1$ and $h_2$ are located on which the line width becomes equal to w minus the given ETCH value. The doses $D_1 = \Phi_1 D(h_1)$ and $D_3 = D(h_3)$, that correspond to the located heights, are the D-S diagram doses for $S_1 = 0$ and $S_3 = c D_3$ respectively, where the backscatter $S_3 = cD_3$ is exactly the maximal backscatter $S_0$ inside large shapes, and the dose $D_3$ is the base dose $D_0$ for the inner points of large shape.

The backscatter around the edge 46 in the center of the basic pattern is equal, to a very good approximation, to $D(y)*c/2$. The width of the narrow line 44 just to the left of the edge 46 is measured and the height h2 at which this width becomes equal to w minus the ETCH value is located. The dose $D_2 = \phi_2 D(h_2)$, that corresponds to this height, vs the backscatter $D(h_2)*c/2$ produces a point in the middle of the D-S diagram.

For greater accuracy one could additionally measure the width of the narrow gap 48 just to the right of the edge 46 and locate the height h5 at which this width becomes equal to w plus the ETCH value. Then the does $D(h_5)$, which corresponds to that height vs the backscatter $D(h_5)*c/2$ serves as a control point of the D-S diagram.

Exactly the same procedure is applied to other basic patterns with widths w smaller than $5\alpha$, so that the three (or four) points of the $\alpha$-boost functions are computed for each size parameter.

It should be noted that a full calibration of the system could be performed in other ways such as by the characterization of the resist dissolution kinetics and further software simulation of the resist development process. The calibration process could take advantage of Monte-Carlo simulation of the distribution of the energy absorbed in the resist, and of dissolution kinetics experiments, which are routinely performed for each resist system. The resist dissolution model is especially suited to the task of defining D-S and $\alpha$-boost diagrams. An experimental method has an advantage over computer simulation methods of the resist development process because the latter could inaccurately simulate or even miss some effects, which influence the resulting shape size.

There has been described a new scheme for E-Beam Proximity correction, based on an etch equalization principle. The invention systematically provides high quality masks for ground-rules down to the order of twice the beam width and allows wide tolerances in the process parameters.

We claim:

1. Method of proximity correction in an E-Beam lithography system for exposing, on an E-beam sensitive resist, a design comprising at least one design shape, the method comprising;

contracting each design shape by a predetermined bias to form a contracted design shape wherein the shape control requirement is that each contracted design shape be enlarged, on development, by the value of the predetermined bias; and determining the E-beam dose required at any given point of the design such that, on development, a shape control requirement is satisfied, wherein the determination of the E-beam dose:

a) is made in accordance with a predetermined relationship between an indicator and the required E-beam dose, the indicator being indicative of the degree of the proximity effect at any point on the design;

b) is constrained so that the dose is zero at points not on a design shape; and c) comprises the step of calculating the solution of an integral equation relating the indicator to the E-beam dose distribution at least at a plurality of points on the design.

2. Method as claimed in claim 1 wherein the indicator is the electron backscatter.

3. Method as claimed in claim 2 wherein the predetermined relationship is predetermined by determining, for the E-beam lithography system and a predetermined value of the bias, a relationship between the backscatter at a point on the edge of a design shape and the E-beam dose required at that point such that the edge of the design shape be moved, on development, by the value of the bias.

4. Method as claimed in claim 2 wherein the predetermined relationship is represented by the equation $D = 2t - 2S$, where D is the required dose, S is the electron backscatter and t is a threshold dose wherein if the dose applied to a point on the resist is greater than the threshold dose the resist is completely dissolved, on development, at that point.

5. Method as claimed in claim 1 wherein the predetermined relationship between the indicator and the required dose is that the required E-beam dose is equal to the indicator for points which lie on a contracted design shape.

6. Method as claimed in claim 5 wherein the determination of the E-beam dose at any given point on the design comprises combining the values of the indicator at ones of the plurality of points.

7. Method as claimed in claim 6 comprising the step of partitioning the shapes of the design into edge regions and internal regions prior to determination of the required dose, each internal region being completely surrounded by an edge region, and wherein the E-beam dose for points in the internal regions is determined with the additional constraint that on development all the resist at that point be dissolved.

8. Method as claimed in claim 7 wherein the solution of the integral equation comprises performing iteratively the steps of:
determining, for each of the plurality of points, the indicator for a trial dose function;
determining, in accordance with the predetermined relationship and from the value of the indicator at each of the plurality of points, the dose required at each of the plurality of points such that the shape control requirement be satisfied and using the determined required dose values as the next trial dose function.

9. Method as claimed in claim 8 wherein the step of determining the required dose comprises multiplying the dose by a correction factor, the correction factor substantially correcting for the shape distortion caused by the forward scattering of the electrons from the resist.

10. Method as claimed claim 9 wherein the plurality of points are arranged on a cartesian grid, the spacing of the grid points being greater than the smallest linear dimension of the smallest design shape.

11. Proximity correction system for an E-beam lithography system wherein a design comprising at least one design shape is exposed on an E-beam sensitive resist, the system comprising:
means for contracting each design shape by a predetermined bias to form a contracted design shape and logic means for determining the E-beam dose required at any given point of the design such that each contracted design shape is enlarged, on development, by the value of the predetermined bias, and wherein;
a) said logic means determines the required E-beam dose according to a predetermined relationship between an indicator and the required E-beam dose, the indicator being indicative of the degree of the proximity effect at any point on the design,
b) said logic means constrains the required E-beam dose to be zero at points not on a design shape; and
c) said logic means comprises means for calculating the solution, at a plurality of points on the design, of an integral equation relating the indicator to the E-beam dose distribution.

12. A proximity correction system, as in claim 11, wherein the indicator is the electron backscatter.

13. A proximity correction system, as in claim 12, wherein the predetermined relationship is represented by the equation $D = 2t - 2S$ and wherein D is the required dose, S is the electron backscatter, and t is a threshold dose such that when a dose is applied to a point on the resist which is greater than said threshold dose then the resist is completely dissolved, on development, at that point on the resist.

* * * * *